(12) United States Patent
Nakayama et al.

(10) Patent No.: US 7,411,263 B2
(45) Date of Patent: Aug. 12, 2008

(54) MAGNETIC MEMORY DEVICE

(75) Inventors: Masahiko Nakayama, Fuchu (JP); Tadashi Kai, Tokyo (JP); Sumio Ikegawa, Musashino (JP); Yoshiaki Fukuzumi, Yokohama (JP); Tatsuya Kishi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 133 days.

(21) Appl. No.: 11/389,110

(22) Filed: Mar. 27, 2006

(65) Prior Publication Data

US 2007/0012972 A1    Jan. 18, 2007

(30) Foreign Application Priority Data

Jul. 15, 2005 (JP) ............................. 2005-207500

(51) Int. Cl.
*H01L 29/82* (2006.01)
*G11C 11/02* (2006.01)

(52) U.S. Cl. ........................ 257/421; 257/295; 257/422; 257/E21.665; 257/E27.005; 365/173

(58) Field of Classification Search ................. 257/295, 257/421, 422
See application file for complete search history.

(56) References Cited

U.S. PATENT DOCUMENTS

| 5,640,343 | A | 6/1997 | Gallagher et al. |
| 5,650,958 | A | 7/1997 | Gallagher et al. |
| 6,104,633 | A | 8/2000 | Abraham et al. |
| 6,765,824 | B2 | 7/2004 | Kishi et al. |
| 6,949,779 | B2 | 9/2005 | Kai et al. |
| 6,956,270 | B2 * | 10/2005 | Fukuzumi ................. 257/421 |
| 7,057,253 | B2 * | 6/2006 | Braun ..................... 257/438 |
| 7,245,524 | B2 * | 7/2007 | Yoda et al. ................ 365/158 |
| 2005/0199926 | A1 | 9/2005 | Fukuzumi et al. |
| 2005/0242384 | A1 | 11/2005 | Iwata et al. |

FOREIGN PATENT DOCUMENTS

JP    3548036    4/2004

OTHER PUBLICATIONS

U.S. Appl. No. 11/244,153, filed Oct. 6, 2005, Masahiko Nakayama et al.
U.S. Appl. No. 11/245,353, filed Oct. 7, 2005, Masahiko Nakayama et al.
U.S. Appl. No. 11/224,094, filed Sep. 13, 2005, Yoshiaki Fukuzumi.
U.S. Appl. No. 11/378,358, filed Mar. 20, 2006, Kai et al.
U.S. Appl. No. 11/389,110, Mar. 27, 2006, Nakayama et al.

* cited by examiner

*Primary Examiner*—Dao H. Nguyen
(74) *Attorney, Agent, or Firm*—Oblon, Spivak, McClelland, Maier & Neustadt, P.C.

(57) ABSTRACT

A magnetic memory device includes a magnetoresistive element and a first wiring layer. The magnetoresistive element includes a fixed layer, a recording layer, and a non-magnetic layer interposed therebetween. The first wiring layer extends in a first direction and generates a magnetic field for recording data in the magnetoresistive element. The recording layer includes a base portion extending in a second direction rotated from the first direction by an angle falling within a range of more than 0° to not more than 20°, and first and second projections projecting from the first and second sides of the base portion in a third direction perpendicular to the second direction. The third and fourth sides of the base portion are inclined with respect to the third direction in the same rotational direction as a rotational direction in which the second direction is rotated.

19 Claims, 9 Drawing Sheets

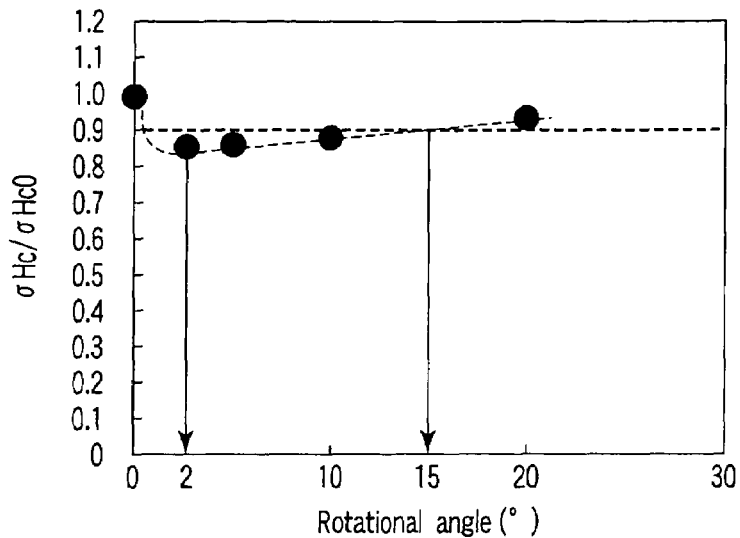
FIG. 8
| Rotational angle (°) | 0 | 2 | 5 | 10 | 20 |
|---|---|---|---|---|---|
| σHc/σHc0 | 1.00 | 0.85 | 0.87 | 0.88 | 0.93 |
FIG. 9
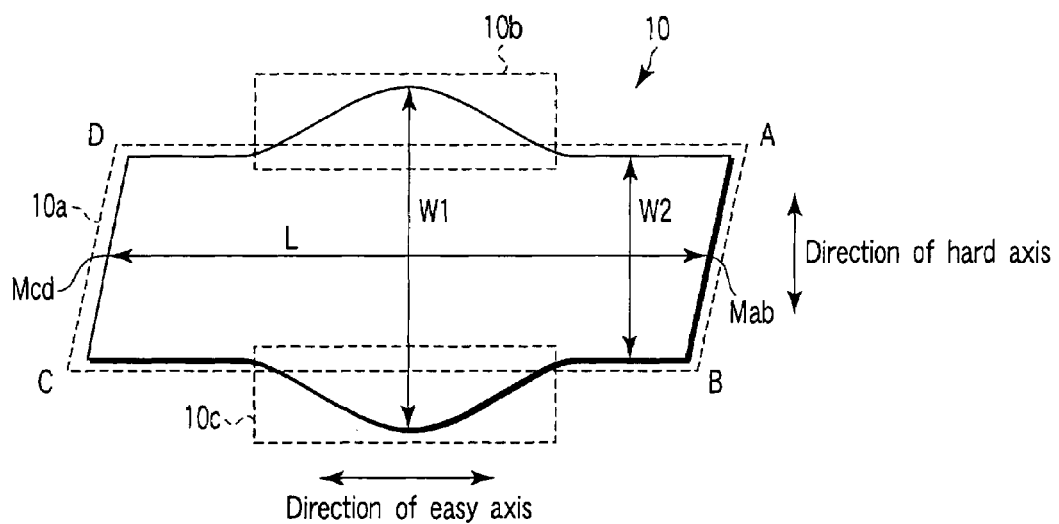
FIG. 10

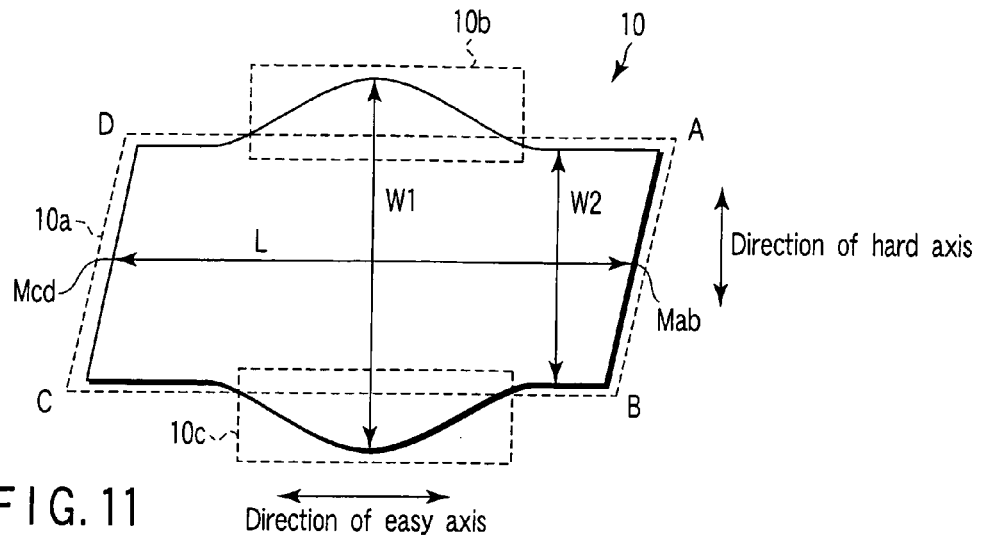
F I G. 11
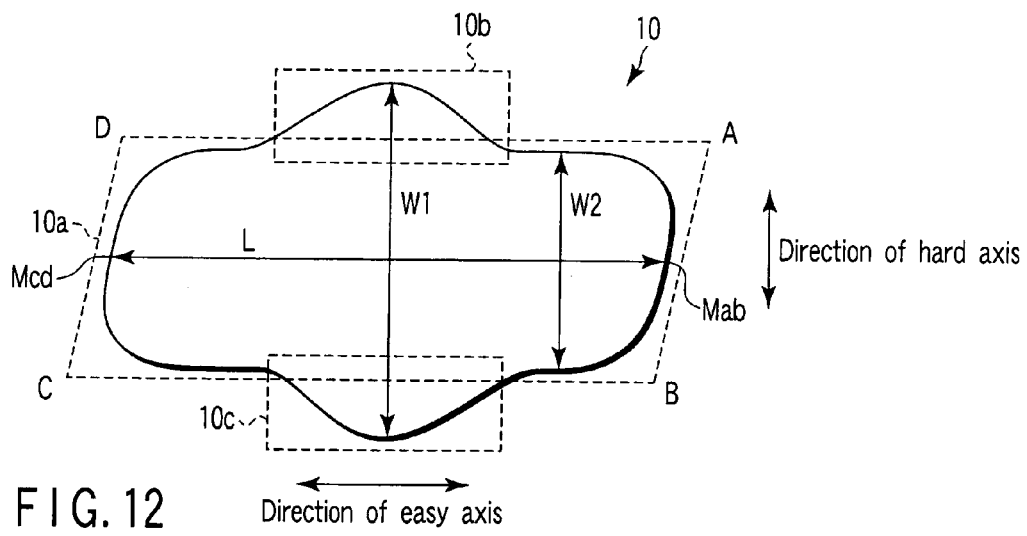
F I G. 12
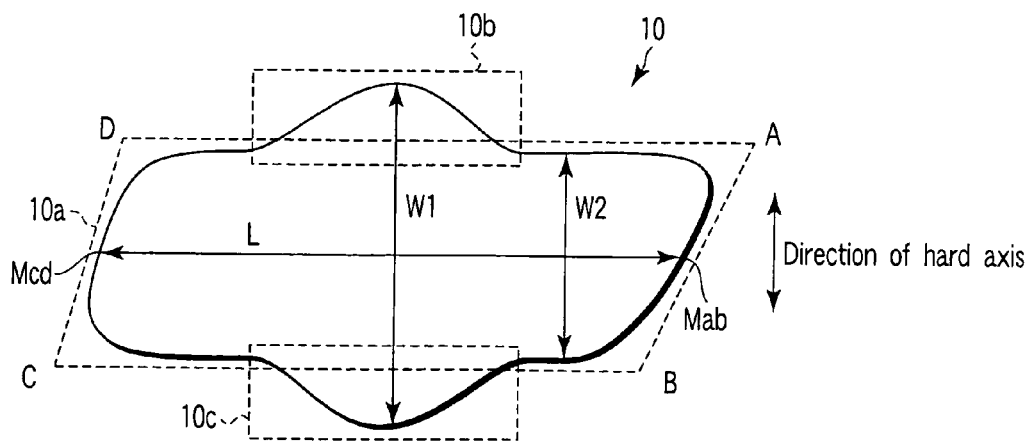
F I G. 13

MAGNETIC MEMORY DEVICE

CROSS-REFERENCE TO RELATED APPLICATIONS

This application is based upon and claims the benefit of priority from prior Japanese Patent Application No. 2005-207500, filed Jul. 15, 2005, the entire contents of which are incorporated herein by reference.

BACKGROUND OF THE INVENTION

1. Field of the Invention

The present invention relates to a magnetic memory device, and more particularly to a magnetic memory device using a magnetoresistive effect element as a memory cell.

2. Description of the Related Art

Various types of magnetic memories have been proposed so far. Further, a magnetic random access memory (MRAM) using magnetoresistive elements that exhibit a giant magnetoresistive effect (GMR) has recently been proposed. In particular, attention is now being paid to an MRAM using a ferromagnetic tunnel junction.

The ferromagnetic tunnel junction is formed of three layers, e.g., a first ferromagnetic layer, an insulation layer and a second ferromagnetic layer. In this structure, a current flows through the insulation layer by tunneling. The resistance of the junction varies in accordance with the cosine concerning the angle between the direction of magnetization of the first ferromagnetic layer and that of the second ferromagnetic layer. Accordingly, the junction resistance assumes the minimum value when the direction of magnetization of the first ferromagnetic layer is parallel with that of the second ferromagnetic layer, and assumes the maximum value when the former is anti-parallel with the latter. This is called a tunneling magnetoresistive (TMR) effect, and there is a case where the rate of change in the junction resistance due to the TMR exceeds 70% at room temperature.

In a memory cell including a ferromagnetic tunnel junction, at least one ferromagnetic layer is regarded as a base layer, and has its direction of magnetization fixed, and the other ferromagnetic layer is used as a recording layer. In this memory cell, data is recorded by making digital information ("0", "1") correspond to the parallel or anti-parallel state, concerning direction of magnetization, of the base layer and recording layer. Writing of data to the memory cell is realized by switching the direction of magnetization of the recording layer, using a magnetic field that is generated by a current guided to write wiring provided for the memory cell.

Further, reading of data from the memory cell is realized by guiding a current to the ferromagnetic tunnel junction and detecting a change in the resistance of the junction due to the TMR effect. A large number of memory cell similar to the above-described memory cell are arranged into a magnetic memory. More specifically, to select an arbitrary cell, a switching transistor is provided for each cell as in, for example, a dynamic random access memory (DRAM), and a peripheral circuit is incorporated. Further, a device, in which a ferromagnetic tunnel junction and diode are provided at the intersection of a word line and bit line, has been proposed (see U.S. Pat. Nos. 5,640,343 and 5,650,958).

To operate an MRAM using memory cells that include ferromagnetic tunnel junctions, it is always necessary to eliminate erroneous writing of data to non-selected cells. In MRAMs, a magnetic field acquired by synthesizing magnetic field Hx, generated in the direction of the axis of easy magnetization, with magnetic field Hy generated in the direction of the axis of hard magnetization is applied to each selected cell, thereby writing data thereto. At this time, no magnetic field is applied or only a one-directional magnetic field is applied to the non-selected cells. Note that the memory cell to which only a one-directional magnetic field is applied is called an incompletely selected cell.

The magnetization switching characteristic in a simultaneous rotation model is expressed by the asteroid curve. As can be understood from the asteroid curve, switching magnetic field intensity Hsw necessary for magnetization switching when a magnetic field is applied in both the direction of easy magnetization and the direction of hard magnetization is lower than easy-axis switching magnetic field intensity Hc. At this time, one-directional magnetic field intensity Hx necessary to write data to a selected memory cell can be set to a value lower than Hc. Accordingly, theoretically, erroneous writing of data to any incompletely selected memory cell can be prevented. Actually, however, variations in switching magnetic field intensity exist, which may cause data to be erroneously written to an incompletely selected memory cell unless Hsw is sufficiently lower than Hc.

On the other hand, since magnetic random access memories function as non-volatile memories, they are required to hold record data in a stable manner. There is a parameter called a thermal fluctuation constant and used as a target for reliably recording data for a long time. It is known that the thermal fluctuation constant is proportional to the volume of the recording layer and switching magnetic field intensity Hsw. Therefore, if switching magnetic field intensity Hsw is reduced to reduce the rate of erroneous writing, the thermal stability is also reduced, with the result that data cannot be held for a long time.

In light of the above, to put a highly integrated magnetic memory into practice, it is very important to propose a magnetoresistive effect element capable of holding data for a long time by enhancing the thermal stability with switching magnetic field intensity Hsw reduced.

Further, Japanese Patent No. 3548036 discloses a technique, related to the above, for correcting the magnetization pattern of a magnetoresistive element to enhance the write characteristics.

BRIEF SUMMARY OF THE INVENTION

According to an aspect of the present invention, there is provided a magnetic memory device comprising:

a magnetoresistive element including a fixed layer having a direction of magnetization thereof fixed, a recording layer having a direction of magnetization thereof varied, and a non-magnetic layer interposed between the fixed layer and the recording layer; and a first wiring layer extending in a first direction and configured to generate a magnetic field for recording data in the magnetoresistive element, wherein the recording layer includes:

a base portion extending in a second direction rotated from the first direction by an angle falling within a range of more than 0° to not more than 20°, the base portion including a first side and a second side opposing each other and extending in the second direction, the base portion also including a third side and a fourth side opposing each other; and a first projection and a second projection outwardly projecting from the first side and the second side, respectively, in a third direction perpendicular to the second direction, the third side and the fourth side being inclined with respect to the third direction in the same rotational direction as a rotational direction in which the second direction is rotated.

BRIEF DESCRIPTION OF THE SEVERAL VIEWS OF THE DRAWING

FIG. 8 is a graph illustrating the dependency of variation σHc of magnetic field intensity Hc of the MTJ element 10 upon the rotational angle;

FIG. 9 is a view illustrating specific values corresponding to the curve shown in FIG. 8;

FIG. 10 is a plan view illustrating a second example of the MTJ element 10;

FIG. 11 is a plan view illustrating a third example of the MTJ element 10;

FIG. 12 is a plan view illustrating a fourth example of MTJ element 10;

FIG. 13 is a plan view illustrating a fifth example of the MTJ element 10;

DETAILED DESCRIPTION OF THE INVENTION

Figure 1:
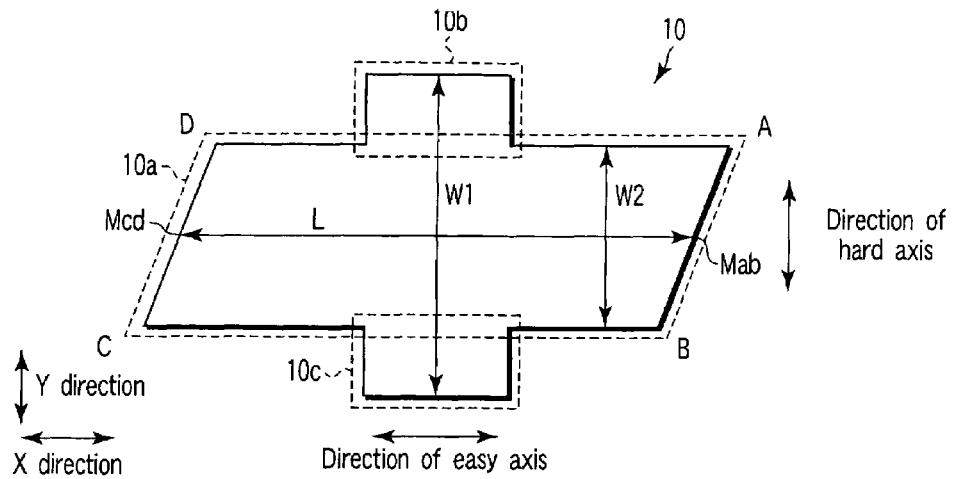
FIG. 1 is a plan view illustrating a first example of an MTJ element 10.

Embodiments of the invention will be described with reference to the accompanying drawings. In the description below, elements having the same function and structure are denoted by the same reference numeral, and a duplicate explanation will be given only when necessary.

For reducing the degree of erroneous writing of data and enhancing the yield, the inventors of the present invention have produced, as described blow, magnetic tunnel junction (MTJ) elements as examples of magnetoresistive effect elements.

Figure 2:
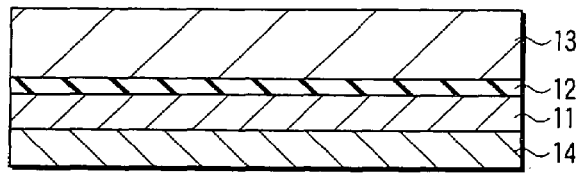
FIG. 2 is a sectional view illustrating the MTJ element 10 shown in FIG. 1.

FIG. 1 is a plan view illustrating a first example of an MTJ element 10. FIG. 2 is a sectional view illustrating the MTJ element 10 shown in FIG. 1. FIG. 2 is a sectional view taken, for example, in the X direction of FIG. 1.

As shown in FIGS. 1 and 2, the first example of the MTJ element 10 at least comprises a fixed layer (also called a pinned layer) 11 having its direction of magnetization fixed, a recording layer (also called a free layer) 13 having its direction of magnetization varied, and a non-magnetic layer (e.g., tunnel insulation layer) 12 interposed between the fixed layer 11 and recording layer 13. An anti-ferromagnetic layer 14, for example, is provided under the fixed layer 11 for fixing the direction of magnetization of the fixed layer 11.

The MTJ element 10 is a so-called cross-shaped element formed of a base portion 10a extending in the X direction, and projections 10b and 10c projecting from, for instance, central portions of opposed sides of the base portion 10a in the Y direction perpendicular to the X direction. In other words, in the planar configuration of the MTJ element 10, the width W1 of the element 10 at the center is greater than the width W2 at an end. Further, in FIG. 1, the length direction, i.e., the X direction, of the base portion 10a is the direction of the axis of easy magnetization of the MTJ element 10, and the projection direction of the projections 10b and 10c, i.e., the Y direction, is the direction of the axis of hard magnetization of the MTJ element 10. The direction of the easy magnetization is defined as the direction in which the magnetic moment of the ferromagnet is the easiest to point. The direction of the hard magnetization is defined as the direction in which the magnetic moment of the ferromagnet is the hardest to point. The axis of easy magnetization and that of hard magnetization will hereinafter be referred to as "easy axis" and "hard axis", respectively.

It is desirable that the projections 10b and 10c project from central portions of opposed sides of the base portion 10a in the Y direction. However, the invention is not limited to this. The projections 10b and 10c may be located asymmetrically with respect to the central line of the base portion 10a that extends in the X direction. Further, the corners of the projections 10b and 10c may be rounded or angled. Namely, the asteroid curve of the MTJ element 10 is not significantly influenced by the shape of each corner of the projection 10b or 10c.

The planar configuration of the base portion 10 is, for example, a rectangle in which adjacent sides thereof do not intersect at right angles. Namely, one pair of angles included in the two pairs of diagonally opposite angles, i.e., the angles of corners A and C, are acute, while the other pair of angles, i.e., the angles of corners B and D, are obtuse. The two opposite sides of the base portion 10a, which are provided with the projections 10b and 10c, are, for example, parallel with each other, and also parallel with the direction (X direction) of extension of the base portion 10a.

It is not always necessary to make, parallel to each other, the other opposite sides of the base portion 10a, which are not provided with the projection 10b or 10c. Namely, it is sufficient if these two sides are inclined in the same direction (i.e., at the same angle) with respect to the hard axis. Further, the four corners A, B, C and D of the base portion 10a may be rounded or angled. In the MTJ element 10 of FIG. 1, the base portion 10a has a planar configuration of a parallelogram.

The planar configuration of the MTJ element 10 has 180° rotation symmetry (or two-rotation symmetry), and has no reflection symmetry. Although the fixed layer 11, non-magnetic layer 12 and recording layer 13 of the MTJ element 10 shown in FIGS. 1 and 2 all have planar configurations, it is sufficient if at least the recording layer 13 has the above-described configuration.

The aspect ratio L/W of the MTJ element 10 is set to a value higher than 1, and desirably to 1.5 to 2.2. The desirable value has been computed in light of variations in switching magnetic field intensity Hc in the direction of the easy axis. If the aspect ratio is set to the desirable value, the variations in switching magnetic field intensity Hc can be suppressed. For example, in the planar configuration as shown in FIG. 1, L of the aspect ratio L/W of the MTJ element 10 is defined as the maximum length in the X direction, and W of the aspect ratio L/W is defined as the maximum length in the Y direction.

In the case of the MTJ element 10 of the shown configuration, the length L is the maximum distance between the X-directional opposite sides of the base portion 10a measured in parallel with the X direction. Further, the width W is the maximum distance between the Y-directional opposing sides of the projections 10b and 10c measured in parallel with the Y direction. In other words, the length L is defined as the distance acquired by connecting the midpoint Mab of the side between the corners A and B to the midpoint Mcd of the side between the corners C and D.

A description will now be given of an example of a material for the MTJ element 10. It is preferable to form the fixed layer 11 and recording layer 13 of, for example, Fe, Co or Ni, stacked layers of these metals, an alloy of these metals, magnetite of a high spin polarizability, an oxide such as $CrO_2$, $RXMnO_{3-y}$ (R: rare metal, X: Ca, Ba, Sr), or a Heusler alloy such as NiMnSb or PtMnSb. These magnetic materials may contain a small amount of a non-magnetic element, such as Ag, Cu, Au, Al, Mg, Si, Bi, Ta, B, C, O, N, Pd, Pt, Zr, Ir, W, Mo or Nb, as long as the magnetic materials do not lose their magnetism.

It is preferable to form the anti-ferromagnetic layer 14 of, for example, Fe—Mn, Pt—Mn, Pt—Cr—Mn, Ni—Mn, Ir—Mn, NiO or $Fe_2O_3$.

The non-magnetic layer 12 may be formed of a dielectric, such as $Al_2O_3$, $SiO_2$, MgO, AlN, $Bi_2O_3$, $MgF_2$, $CaF_2$, $SrTiO_2$ or $AlLaO_3$. These dielectrics may have a loss of contain oxygen, nitrogen or fluoride.

Figure 3:
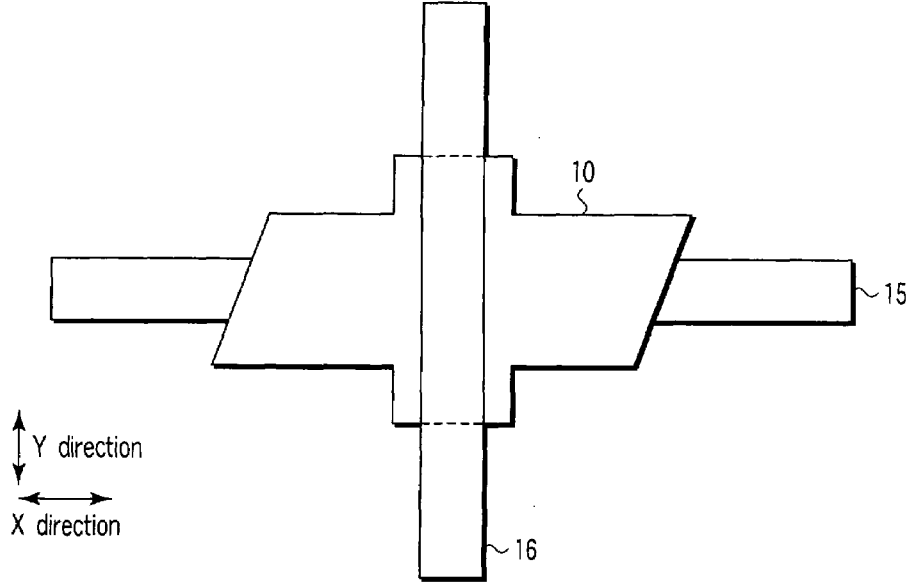
FIG. 3 is a plan view illustrating an essential part of an MRAM with the MTJ element 10 shown in FIG. 1.

The asteroid curve of the MTJ element 10 constructed as the above will be described. FIG. 3 is a plan view illustrating an essential part of an MRAM with the MTJ element 10 of FIG. 1. As shown in FIG. 3, a first write wiring layer (first write wiring) 15 extends in the X direction, and a second write wiring layer (second write wiring) 16 extends in the Y direction perpendicular to the X direction. The first write wiring 15 applies a Y-directional magnetic field to the MTJ element 10, and the second write wiring 16 applies an X-directional magnetic field to the MTJ element 10.

The MTJ element 10 is provided at the intersection of the first and second write wiring 15 and 16. More specifically, the easy axis of the MTJ element 10 is substantially parallel with the direction of extension of the first write wiring 15. The hard axis of the MTJ element 10 is substantially parallel with the direction of extension of the second write wiring 16.

Figure 4:
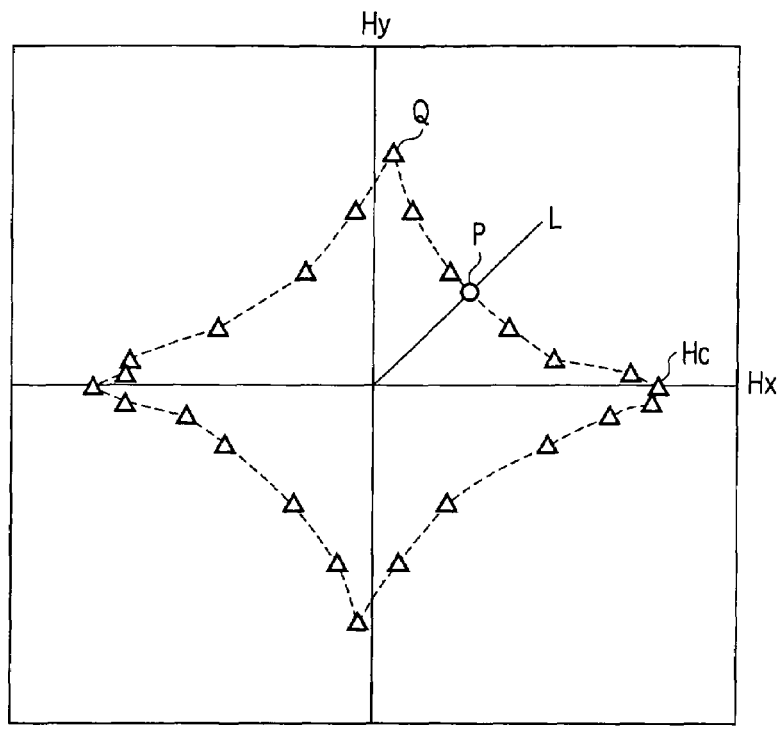
FIG. 4 is a graph illustrating the asteroid curve of the MTJ element 10 shown in FIG. 3.

FIG. 4 is a graph illustrating the asteroid curve of the MTJ element 10 shown in FIG. 3. Assume here that the write magnetic field (the synthesis magnetic field of the easy-axis-directional magnetic field and hard-axis-directional magnetic field) necessary for magnetization switching at point P at which line L inclined by 45° with respect to the X axis intersects the asteroid curve is defined as switching magnetic field intensity Hsw. Assume also that the write magnetic field necessary for magnetization switching only in the easy-axis direction (i.e., the magnetic field intensity at a point at which the asteroid curve intersects the X axis) is defined as switching magnetic field intensity Hc.

Magnetic field intensity Hsw necessary for magnetization switching when a magnetic field is applied in the easy-axis direction and hard-axis direction is smaller than magnetic field intensity Hc necessary for magnetization switching when a magnetic field is applied only in the easy-axis direction. At this time, since single-directional magnetic field intensity Hx necessary to write data to a selected memory cell can be set smaller than magnetic field intensity Hc, erroneous writing of data to an incompletely selected memory cell does not theoretically occur. However, in actual memory cells, variations exist in switching magnetic field intensity, therefore unless Hsw is set to a value sufficiently lower than Hc, erroneous writing of data to the incompletely selected memory cell may well occur.

As is evident from FIG. 4, in such an MTJ element 10 as has the configuration shown in FIG. 1, Hc is sufficiently high with respect to Hsw, and the write margin and thermal stability are enhanced.

However, if a close inspection is made on the portions of the asteroid curve near the X axis, the asteroid curve is asymmetrical in the first and second quadrants. Further, point Q, at which the asteroid curve is closed when a Y-directional magnetic field is applied, is slightly deviated from the Y axis. This will reduce the write margin and hence is not preferable.

First Embodiment

Figure 5:
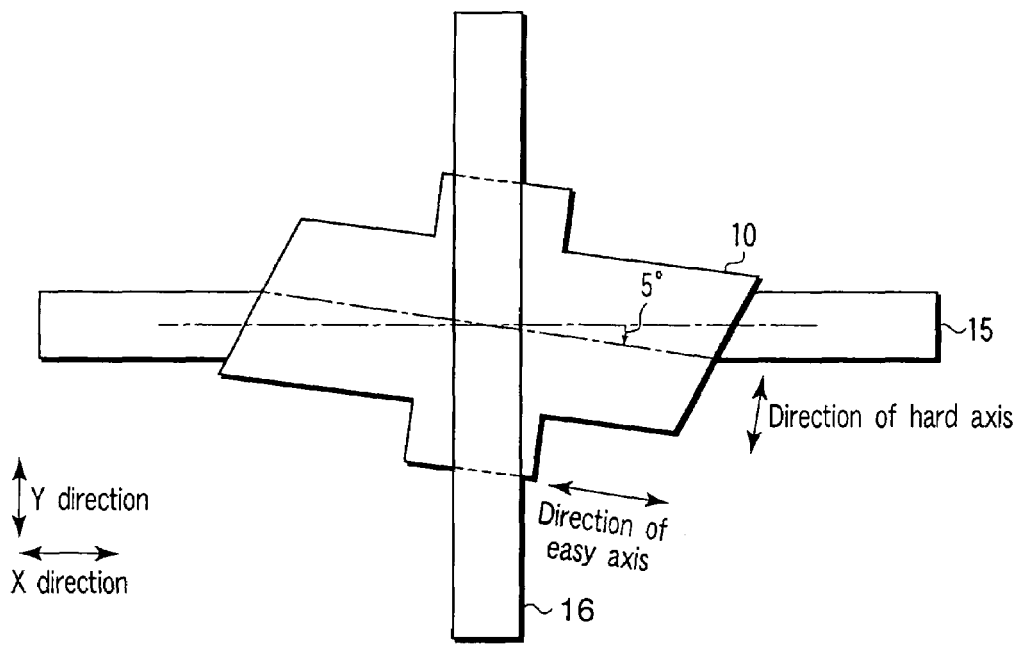
FIG. 5 is a plan view illustrating an essential part of an MRAM with the MTJ element 10 according to a first embodiment of the invention.

FIG. 5 is a plan view illustrating an essential part of an MRAM with the above-described MTJ element 10 according to a first embodiment of the invention.

As shown, first write wiring 15 extends in the X direction, and second write wiring 16 extends in the Y direction perpendicular to the X direction. The first write wiring 15 applies a Y-directional magnetic field to the MTJ element 10, and the second write wiring 16 applies an X-directional magnetic field to the MTJ element 10. The first and second write wiring 15 and 16 may be provided separate by a preset distance from the MTJ element 10, or be electrically connected thereto.

The MTJ element 10 is provided at the intersection of the first and second write wiring 15 and 16. The easy axis of the MTJ element 10 is inclined by, for example, 5° with respect to the direction of extension of the first write wiring 15 (i.e., the X direction). Similarly, the hard axis of the MTJ element 10 is inclined by, for example, 5° with respect to the direction of extension of the second write wiring 16 (i.e., the Y direction).

The direction of rotation of the MTJ element 10 is the same as the direction in which the opposite sides of the base portion 10a, which are not provided with the projection 10b or 10c, are inclined with respect to the hard axis (Y axis).

Figure 6:
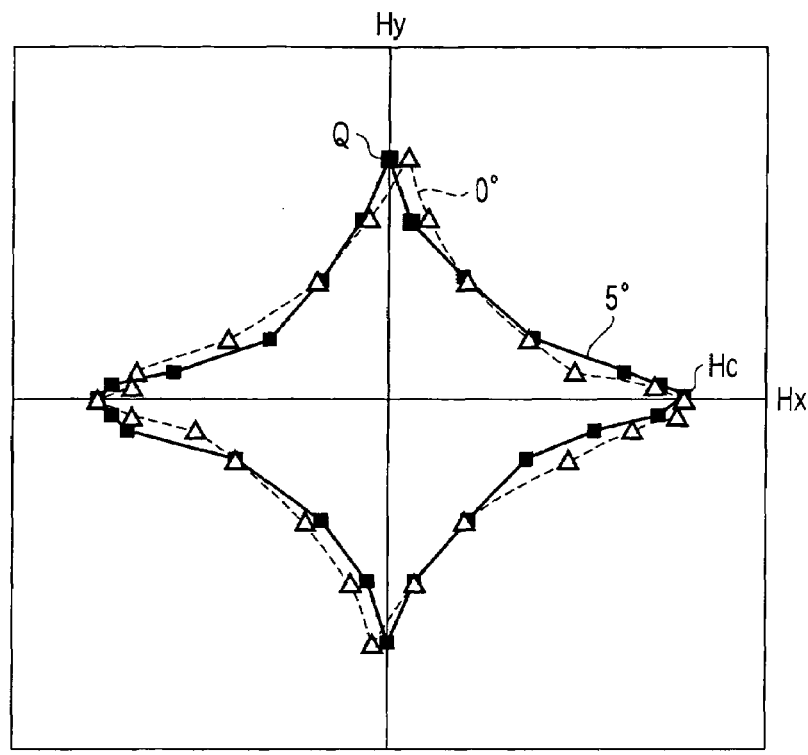
FIG. 6 is a graph illustrating the asteroid curve of the MTJ element 10 shown in FIG. 5.

FIG. 6 shows the asteroid curve of the MTJ element 10 shown in FIG. 5. FIG. 6 also shows the asteroid curve of a comparative in which the easy axis is substantially parallel with the first write wiring 15 (rotational angle of 0°). Namely, FIG. 6 shows the asteroid curve of the MTJ element 10 shown in FIG. 3

As is evident from FIG. 6, when the asteroid curve of the MTJ element 10 that is not inclined is compared with that of the MTJ element 10 inclined by 5°, the degree of asymmetry near the X axis between the first and second quadrants is lower in the latter MTJ element 10 than in the former MTJ element 10. Therefore, the write margin can be enhanced.

Further, point Q, at which the asteroid curve is closed when a Y-directional magnetic field is applied, is substantially identical to the Y axis in the latter MTJ element 10, whereas in the former MTJ element 10, the point is slightly deviated from the Y axis. Namely, the degree of asymmetry near the Y axis between the first and second quadrants is also lower in the latter MTJ element 10 than in the former MTJ element 10.

A description will now be given of easy-axis switching magnetic field intensity Hc and variation σHc in Hc acquired when the rotational angle of the MTJ element 10 is changed.

Figure 7:
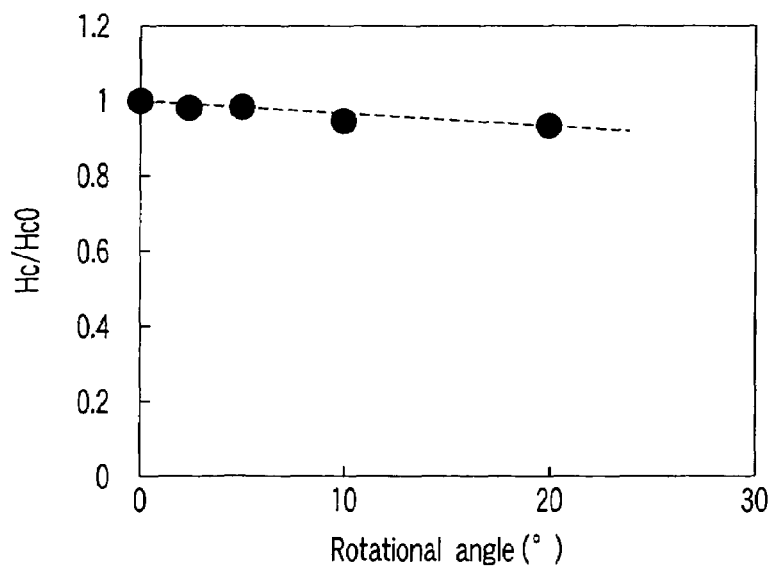
FIG. 7 is a graph illustrating the dependency of magnetic field intensity Hc of the MTJ element 10 upon the rotational angle.

FIG. 7 is a graph illustrating the dependency of magnetic field intensity Hc of the MTJ element 10 upon the rotational angle. The abscissa indicates the rotational angle (°), and the ordinate indicates the ratio of Hc to Hc0. Hc0 indicates Hc acquired when the rotational angle is 0°. Namely, in FIG. 7, magnetic field intensity Hc is standardized by east-axis switching magnetic field intensity Hc0 of the MTJ element 10 acquired when the rotational angle is 0°.

As can be understood from FIG. 7, when the rotational angle of the MTJ element 10 is varied within the range of more than 0° to not more than 20°, magnetic field intensity Hc is little changed. In other words, in the range of more than 0° to not more than 20°, Hc is sufficiently high with respect to Hsw, and hence the effect of enhancing the write margin and thermal stability is substantially the same as in the case where the rotational angle is 0°.

FIG. 8 is a graph illustrating the dependency of variation σHc of magnetic field intensity Hc of the MTJ element 10 upon the rotational angle. The abscissa indicates the rotational angle (°), and the ordinate indicates the ratio of σHc to σHc0. σHc0 indicates σHc acquired when the rotational angle is 0°. Namely, in FIG. 8, variation σHc is standardized by variation σHc0 of the MTJ element 10 acquired when the rotational angle is 0°. FIG. 9 shows specific values of σHc/σHc0 corresponding to the rotational angles 0°, 2°, 5°, 10° and 20°.

As can be understood from FIG. 8, as the rotational angle of the MTJ element 10 is increased, σHc/σHc0 is reduced. Further, when the rotational angle falls within a range of more than 0° to not more than 20°, σHc/σHc0 is abruptly reduced, and it is minimum when the rotational angle is 2°.

When σHc/σHc0 is lower than 1, the write margin for reducing variation σHc is increased. Namely, if the rotational angle falls within the range of more than 0° to not more than 20°, σHc can be reduced.

Further, if the rotational angle falls within the range of more than 0° to not more than 15°, σHc can be reduced by 10% or more. Accordingly, in this range, the effect of reducing variation σHc is significant.

In particular, when the rotational angle is 10°, σHc assumes a value (specifically, 0.88) lower by more than 10% than the value acquired when the rotational angle is 0°. When the rotational angle is 5°, σHc is reduced up to 0.87. In light of this, it is most desirable to set the rotational angle to more than 0° to not more than 5°.

As described above in detail, in the embodiment, X-directional switching magnetic field intensity Hc can be set to a sufficiently high value with respect to Hsw, with the result that the write margin and thermal stability can be enhanced, thereby reducing the degree of erroneous writing of data to the MTJ element 10.

Furthermore, variation σHc in magnetic field intensity Hc can be reduced without reducing magnetic field intensity Hc, which enhances the yield of MTJ elements 10.

Note that when the inclination (or rotational angle), with respect to the hard axis, of the opposite sides of the base portion 10a, which are provided with no projections, is changed, Hsw of the asteroid curve is also changed. However, even if the rotational angle of those sides is changed, the asymmetry of the asteroid curve is little changed. Accordingly, even if the embodiment is applied to the MTJ element 10 in which the rotational angle of those opposite sides is changed, the same advantage as the above can be acquired.

Also, as described above, the MTJ element 10 may be constructed such that only the recording layer 13 has the base portion 10a and projections 10b and 10c. Namely, the asteroid curve of the MTJ element 10 is substantially determined from the planar configuration of the recording layer 13. Therefore, the planar configuration of the fixed layer 11, non-magnetic layer 12 or anti-ferromagnetic layer 14 is not limited to the above-mentioned one, but may be, for example, a rectangle.

Second Embodiment

The MTJ element 10 used in the present invention is not limited to the configuration employed in the first embodiment, but may be modified in various ways. An MTJ element 10 according to a second embodiment has another configuration. Also in the second embodiment, it is a matter of course that the easy axis can be rotated within the range of more than 0° to not more than 20° with respect to the first write wiring 15.

FIG. 10 is a plan view illustrating a second example of the MTJ element 10 according to the second embodiment. As shown, the base portion 10a has a shape of, for example, a parallelogram, and the projections 10b and 10c are rounded. The projections 10b and 10c may have rounded corners, or may be entirely rounded as shown in FIG. 10. Namely, the degree of rounding (more specifically, curvature radius R) is not limited to a particular value. Alternatively, the projections 10b and 10c may have linearly cut-away corners. The aspect ratio of the MTJ element of FIG. 10 is identical to that of the MTJ element of FIG. 1.

FIG. 11 is a plan view illustrating a third example of the MTJ element 10. The MTJ element of FIG. 11 is acquired by reducing the aspect ratio of the MTJ element of FIG. 10. However, the former also satisfies the condition that the aspect ratio is not less than 1. Thus, an MTJ element 10 having a low aspect ratio can also be used.

FIG. 12 is a plan view illustrating a fourth example of the MTJ element 10. The base portion 10a of the fourth example has rounded corners. The curvature radius of each corner of the fourth example is not limited to any particular value. Alternatively, the base portion 10a may have linearly cut-away corners, instead rounded corners. The projections 10b and 10c of the fourth example are rounded. Alternatively, they may have angled corners. Actually, from the etching accuracy in the manufacturing process, it is difficult to form such an MTJ element 10 as shown in FIG. 1, in which all corners are angled. It is easier to produce such an MTJ element as shown in FIG. 12, and hence it is strongly possible that such an MTJ element as shown in FIG. 12 is actually employed. Further, the length L of the MTJ element shown in FIG. 12 is defined as the distance between the midpoint Mab of the side AB and the midpoint Mcd of the side CD.

FIG. 13 is a plan view illustrating a fifth example of the MTJ element 10. The opposite sides of the base portion 10a, which are not provided with the projection 10b or 10c, are inclined in the same direction at different angles with respect to the hard axis.

In other words, one pair of angles included in the two pairs of diagonally opposite angles, i.e., the angles of corners A and C, are different acute angles, while the other pair of angles, i.e., the angles of corners B and D, are different obtuse angles. The corners of the base portion 10a are, for example, rounded. The projections 10b and 10c are, for example, rounded.

Figure 14:
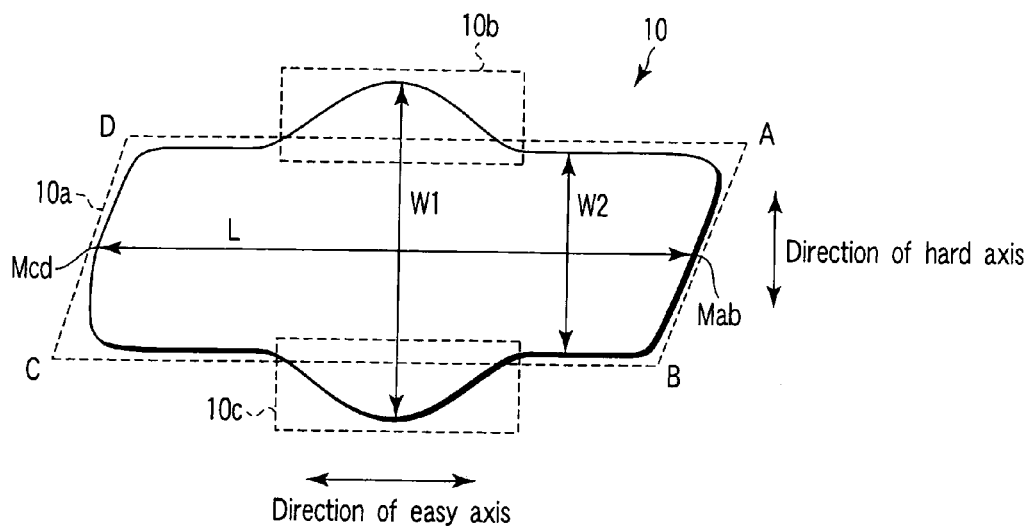
FIG. 14 is a plan view illustrating a sixth example of MTJ element 10.

FIG. 14 is a plan view illustrating a sixth example of the MTJ element 10. Two corners A and C of the base portion 10a corresponding to acute corners have different curvature radiuses. Namely, corner A, included in corners A and C corresponding to the acute angles, has a smaller radius of curvature than corner C. The projections 10b and 10c are, for example, rounded.

Also when the above-mentioned MTJ elements 10 are employed, and even when they are arranged with the angle thereof rotated with respect to the write wiring 15 and 16, the same advantage as in the first embodiment can be acquired. It is a matter of course that only the recording layer 13 in each MTJ element 10 may have the above-described configuration.

A method for manufacturing such an MTJ element 10 as the above will now be described.

[1] Manufacturing Method Example 1

In a manufacturing method example 1, an MTJ element 10 of a standard size is manufactured.

Firstly, an MTJ material layer is formed by sputtering, and a resist is coated on the MTJ material layer. Subsequently, a pattern is formed in the layer, using light, an electron beam or X-rays, and is developed into a resist pattern. Using the resist pattern as a mask, the MTJ material layer is subjected to ion milling or etching, thereby forming an MTJ element 10 of a desired configuration. After that, the resist layer is removed.

[2] Manufacturing Method Example 2

In a manufacturing method example 2, an MTJ element 10 of a relatively large size, e.g., of a micron-order size, is manufactured.

Firstly, an MTJ material layer is formed by sputtering, and a hard mask formed of, for example, silicon oxide or silicon nitride, is formed. The hard mask is etched into a hard mask pattern of a desired configuration, using reactive ion etching (RIE). Using this hard mask pattern, the MTJ material layer is subjected to ion milling to form an MTJ element 10 of a desired configuration.

[3] Manufacturing Method Example 3

In a manufacturing method example 3, an MTJ element 10 of a relatively small size, e.g., of a sub-micron-order size ranging from about 2-3 µm to about 0.1 µm, is manufactured. For manufacturing an MTJ element of such a size as this, photolithography can be utilized as follows:

Firstly, an MTJ material layer is formed by sputtering, and a hard mask formed of, for example, silicon oxide or silicon nitride, is formed. The hard mask is etched into a hard mask pattern of a desired configuration, using photolithography. Using this hard mask pattern as a mask, the MTJ material layer is subjected to RIE to form an MTJ element 10 of a desired configuration.

[4] Manufacturing Method Example 4

In a manufacturing method example 4, an MTJ element 10 of a yet smaller size, e.g., of about 0.5 µm or less, is manufactured. For manufacturing an MTJ element of such a size as this, electron beam exposure can be utilized.

However, in this case, since the element is very small, the part of the element that is used for increasing the edged domain region employed in an embodiment of the invention is extremely small. Accordingly, it is very difficult to manufacture such an MTJ element.

In light of this, to manufacture an MTJ element 10 of a desired configuration according to the embodiment, optical proximity correction of an electron beam is utilized. The optical proximity correction method is used to correct a proximity effect that occurs in the pattern due to rearward scatter of an electron beam from the substrate, thereby forming a correct pattern. Optical proximity correction is executed, for example, as follows. When, for example, a rectangular pattern is formed, a phenomenon occurs in which only a small amount of charge is accumulated near each corner of the rectangular pattern, and hence each corner is rounded. To sharpen each corner, a correction point beam is applied to the portion of the pattern near each corner, e.g., the portion outside the pattern in the case of, in particular, an element of about 0.5 µm or less, thereby increasing the amount of the accumulated charge to acquire a correct pattern.

In the manufacturing method example 4, using the above-described proximity effect correction of an electron beam, a configuration in which element corners are formed wide is acquired in the following manner. For instance, when a so-called cross-shaped element is formed, a correction point beam is applied to each of the opposite portions of the element where projections are to be formed. As a result, wide projections are formed at the opposite sides of the element. At this time, it is advisable to correct the configuration of the element so as to, for example, sharpen each corner by applying thereto a larger amount of charge, and/or more appropriately adjusting the correction point beam application position, than in the case of standard proximity effect correction. Furthermore, to form a so-called cross-shaped pattern, a plurality of correction point beams may be applied.

Third Embodiment

A third embodiment is directed to an MRAM structure example using the above-described MTJ element 10.

It is preferable to use the above-described MTJ element 10 as a memory element for a memory cell incorporated in an MRAM. In general, an MRAM using a magnetic member as a recording layer requires a thermally stable recording layer that is free from erroneous writing of data to adjacent cells, and can hold record data for a long time even if memory cells are reduced in size. If the MTJ element according to an embodiment is used, a memory cell having a low switching magnetic field intensity and sufficiently high thermal fluctuation constant can be provided. As a result, the current needed for writing a record bit can be reduced.

A description will now be given of each of the memory cell structures for an MRAM, i.e., [1] selective transistor type, [2] selective diode type, and [3] cross-point type.

[1] Selective Transistor Type

Figure 15:
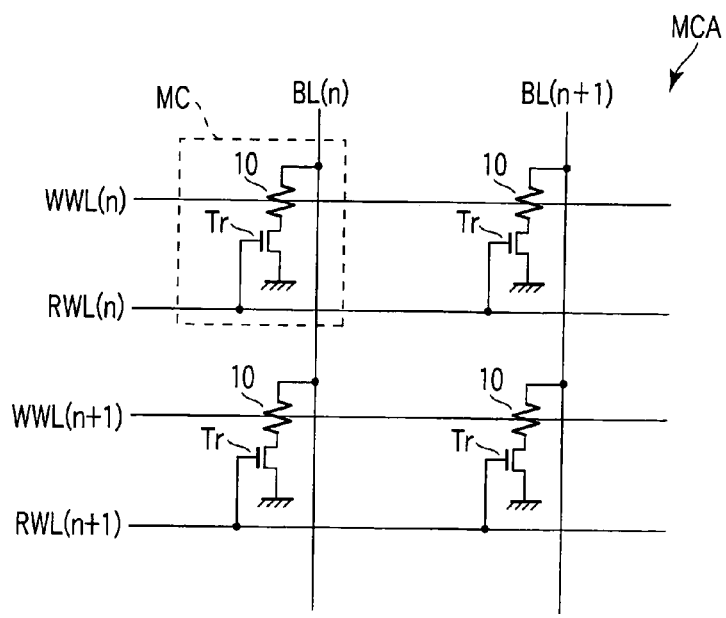
FIG. 15 is a circuit diagram illustrating a selective-transistor-type MRAM according to a third embodiment of the invention.
Figure 16:
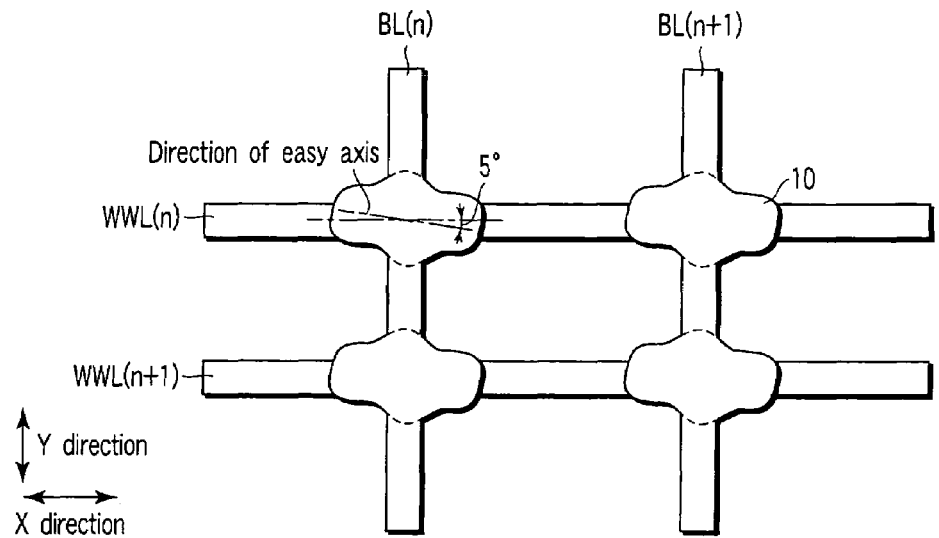
FIG. 16 is a plan view illustrating the structure of the selective-transistor-type MRAM shown in FIG. 15.
Figure 17:
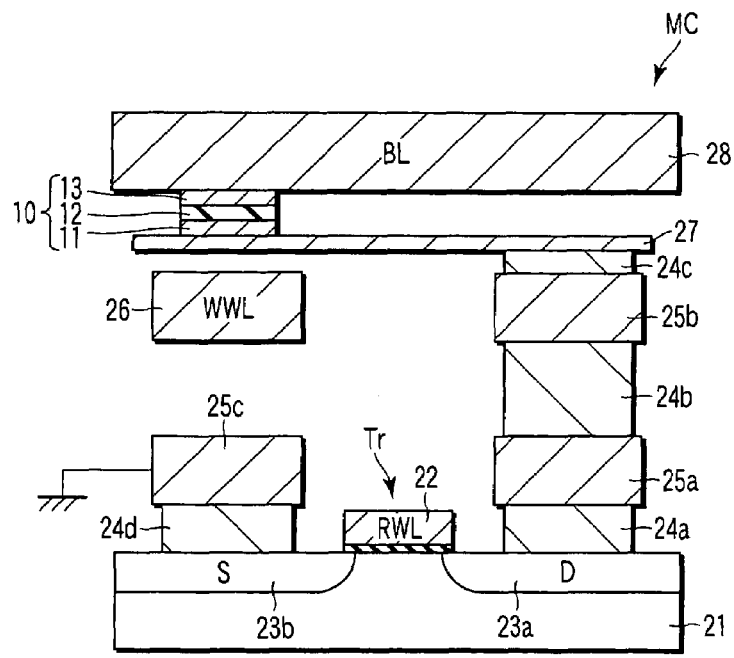
FIG. 17 is a sectional view illustrating the structure of the selective-transistor-type MRAM shown in FIG. 15.

FIG. 15 is a circuit diagram illustrating a selective-transistor-type MRAM according to the third embodiment of the invention. FIG. 16 is a plan view illustrating the structure of the selective-transistor-type MRAM shown in FIG. 15. FIG. 17 is a sectional view illustrating the structure of a memory cell MC incorporated in the selective-transistor-type MRAM shown in FIG. 15. For facilitating the description, FIG. 16 shows only a bit line (BL), word line (WWL) and MTJ element 10. In the structure of FIG. 17, an interlayer insulation layer (not shown) is filled between a semiconductor substrate 21 and bit line (BL) 28.

As shown, the selective-transistor-type memory cell MC comprises a MTJ element 10, transistor Tr (e.g., metal oxide semiconductor (MOS) transistor) electrically connected to the MTJ element 10, bit line (BL) 28 and word line (WWL) 26. Memory cells MC similar to this cell are arranged in an array, thereby providing a memory cell array MCA. The word line (WWL) 26 corresponds to the first write wiring 15 shown in FIG. 5, and the bit line (BL) 28 corresponds to the second write wiring 16 shown in FIG. 5.

Specifically, an end of the MTJ element 10 is electrically connected to an end (drain diffusion region) 23a of the current path of the transistor Tr via a base metal layer 27, contact plugs 24a, 24b and 24c and wiring layers 25a and 25b. The other end of the MTJ element 10 is electrically connected to the bit line 28. The write word line (WWL) 26 is provided below the MTJ element 10. The write word line (WWL) 26 may be electrically connected to or disconnected from the MTJ element 10. The other end (source diffusion region) 23b of the current path of the transistor Tr is, for example, grounded via a contact plug 24d and wiring layer 25c. The gate electrode 22 of the transistor Tr functions as a read word line (RWL).

The end of the MTJ element 10 coupled to the base metal layer 27 is formed of, for example, the fixed layer 11, and the other end of the MTJ element 10 coupled to the bit line 28 is formed of, for example, the recording layer 13, but may be vice versa. Further, a hard mask may be interposed between the MTJ element 10 and bit line 28.

As shown in FIG. 16, the MTJ element 10 has its easy axis inclined by, for example, 5° with respect to the direction of extension of the word line (WWL) 26, i.e., the X direction. In other words, the MTJ element 10 has its hard axis inclined by, for example, 5° with respect to the direction of extension of the bit line (BL) 28, i.e., the Y direction. Further, the MTJ element 10 has, for example, such a planar configuration as shown in FIG. 12.

Data is written to and read from the selective-transistor-type memory cell MC, constructed as the above, as follows:

<Writing Operation>

The bit line 28 and write word line 26 corresponding to a selected one of the MTJ elements are selected (activated). When write currents Iw1 and Iw2 are guided to the selected bit line 28 and write word line 26, respectively, a synthesis magnetic field due to the write currents Iw1 and Iw2 is applied to the selected MTJ element 10. As a result, the direction of magnetization of the recording layer 13 incorporated in the MTJ element 10 is switched, and the direction of magnetization of the fixed layer 11 becomes parallel or anti-parallel with that of the recording layer 13. If the parallel state and anti-parallel state concerning the direction of magnetization are defined as "1" and "0", respectively, writing of digital data can be realized.

<Reading Operation>

Data reading is executed as follows, using the transistor Tr that functions as a switching element for reading. The bit line 28 and read word line (RWL) 22 corresponding to a selected one of the MTJ elements are selected (activated), thereby guiding, to the MTJ element 10, a read current Ir that passes through the non-magnetic layer 12 by tunneling. At this time, the junction resistance is varied in accordance with the cosine corresponding to the angle between the direction of magnetization of the fixed layer 11 and that of the recording layer 13, thereby providing a tunnel magnetic resistance (TMR) effect. The TMR effect is a phenomenon in which if the direction of magnetization of the fixed layer 11 is parallel with that of the recording layer 13 (i.e., the data is "1"), the junction resistance is low, whereas if the former is anti-parallel with the latter (i.e., the data is "0"), the junction resistance is high. Thus, the state "1" or "0" of the MTJ element 10 can be determined by detecting the junction resistance.

[2] Selective Diode Type

Figure 18:
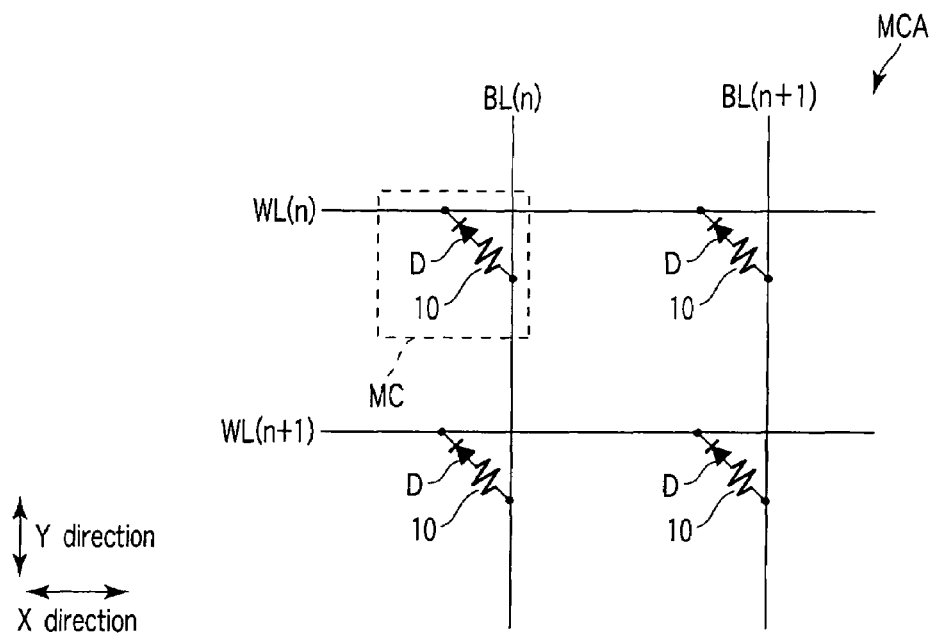
FIG. 18 is a circuit diagram illustrating a selective-diode-type MRAM according to the third embodiment of the invention.
Figure 19:
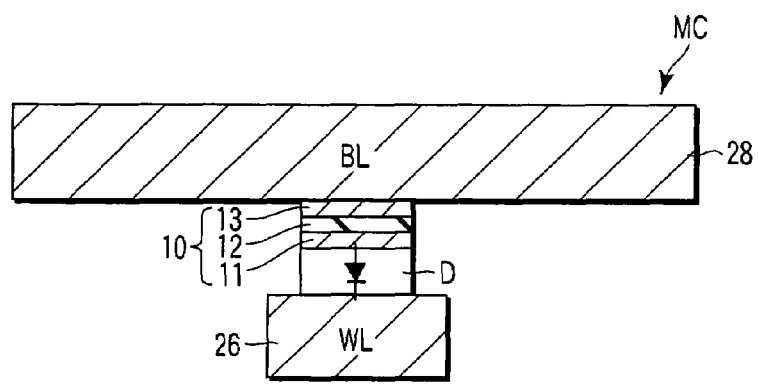
FIG. 19 is a sectional view illustrating a memory cell MC incorporated in the selective-diode-type MRAM of FIG. 18.
Figure 19:
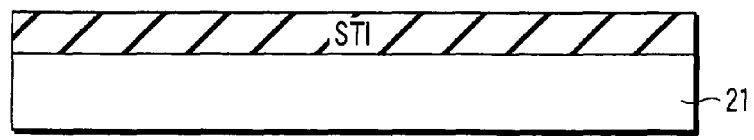

FIG. 18 is a circuit diagram illustrating a selective-diode-type MRAM according to the third embodiment of the invention. FIG. 19 is a sectional view illustrating a memory cell MC incorporated in the selective-diode-type MRAM of FIG. 18. In the example of FIG. 18, a shallow trench isolation (STI) layer and interlayer insulation layer (not shown) are filled between the semiconductor substrate 21 and bit line (BL) 28.

As shown in FIGS. 18 and 19, the selective-diode-type memory cell MC comprises a MTJ element 10, diode D electrically connected to the MTJ element 10, bit line (BL) 28 and word line (WWL) 26. Memory cells MC similar to this cell are arranged in an array, thereby providing a memory cell array MCA.

The diode D is, for example, a pn-junction diode that comprises a p-type semiconductor layer and n-type semiconductor layer. An end (e.g., the p-type semiconductor layer) of the diode D is electrically connected to the MTJ element 10. The other end (e.g., the n-type semiconductor layer) of the diode D is electrically connected to the word line 26. In the shown structure, a current flows from the bit line 28 to the word line 26.

The location and orientation of the diode D can be varied. For instance, the orientation of the diode D may be set to guide a current from the word line 26 to the bit line 28. Further, the diode D may be formed in the semiconductor substrate 21. The diode D may have the same configuration (e.g., a so-called cross shape) as the MTJ element 10.

The MTJ element 10 has its easy axis inclined by, for example, 5° with respect to the direction of extension of the word line (WL) 26, i.e., the X direction. In other words, the MTJ element 10 has its hard axis inclined by, for example, 5° with respect to the direction of extension of the bit line (BL) 28, i.e., the Y direction. Further, the MTJ element 10 has, for example, such a planar configuration as shown in FIG. 12.

In the selective-diode-type memory cell MC constructed as the above, the operation of writing data is similar to that in the selective-transistor-type memory cell MC. Namely, currents Iw1 and Iw2 are supplied to the bit line 28 and word line 26, respectively, thereby making the direction of magnetization of the recording layer 13 and that of fixed layer 11 of the MTJ element 10 parallel with or anti-parallel with each other.

The operation of reading data is also substantially the same as in the selective-transistor-type memory cell MC. However, in the selective-diode-type memory cell MC, the diode D is used as a switching element. Namely, the rectifying function of the diode D is utilized to control the bit lines 28 and word lines 26 to apply a reverse bias to non-selected MTJ elements, thereby causing current Ir to flow into only a selected MTJ element 10.

[3] Cross-point Type

Figure 20:
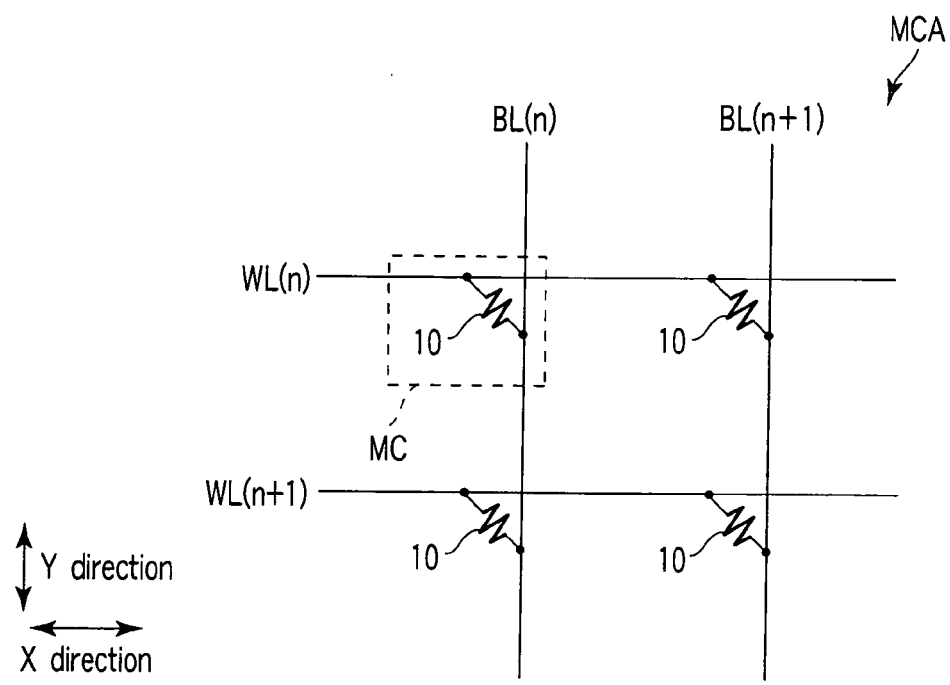
FIG. 20 is a circuit diagram illustrating a cross-point-type MRAM according to the third embodiment of the invention.
Figure 21:
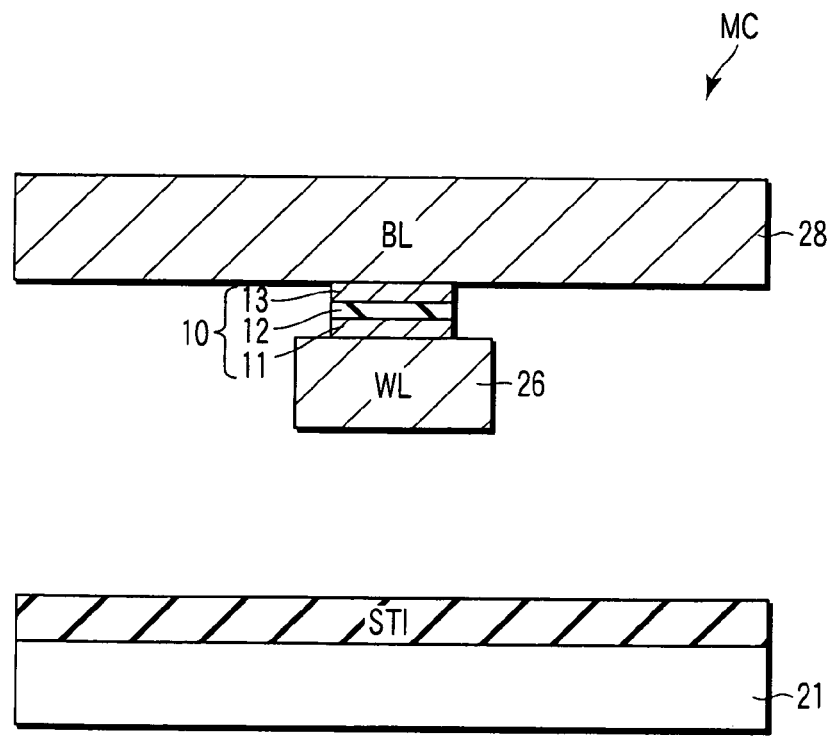
FIG. 21 is a sectional view illustrating a memory cell MC incorporated in the cross-point-type MRAM of FIG. 20.

FIG. 20 is a circuit diagram illustrating a cross-point-type MRAM according to the third embodiment of the invention. FIG. 21 is a sectional view illustrating a memory cell MC incorporated in the cross-point-type MRAM of FIG. 20. In the example of FIG. 20, a shallow trench isolation (STI) layer and interlayer insulation layer (not shown) are filled between the semiconductor substrate 21 and bit line (BL) 28.

As shown in FIGS. 20 and 21, the cross-point type memory cell MC comprises a MTJ element 10, bit line (BL) 28 and word line (WL) 26. Memory cells MC similar to this cell are arranged in an array, thereby providing a memory cell array MCA.

Specifically, the MTJ element 10 is positioned near the intersection of the bit line 28 and word line 26. An end of the MTJ element 10 is electrically connected to the word line 26, and the other end of the element 10 is electrically connected to the bit line 28.

The MTJ element 10 has its easy axis inclined by, for example, 5° with respect to the direction of extension of the word line (WL) 26, i.e., the X direction. In other words, the MTJ element 10 has its hard axis inclined by, for example, 5° with respect to the direction of extension of the bit line (BL) 28, i.e., the Y direction. Further, the MTJ element 10 has, for example, such a planar configuration as shown in FIG. 12.

In the cross-point type memory cell MC constructed as the above, the operation of writing data is similar to that in the selective-transistor-type memory cell MC. Namely, currents Iw1 and Iw2 are supplied to the bit line 28 and word line 26, respectively, thereby making the direction of magnetization of the recording layer 13 and that of fixed layer 11 of the MTJ element 10 parallel with or anti-parallel with each other. In contrast, to read data from a selected MTJ element 10, read current Ir is supplied to the bit line 28 and word line 26 connected to the selected MTJ element 10.

As described above in detail, a plurality of types of magnetic random access memories (MRAM) can be constructed using MTJ elements 10. The above-described MRAMs types are just examples, and the present invention is also applicable to other types of MRAMs.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic memory device comprising:
   a magnetoresistive element including a fixed layer having a direction of magnetization thereof fixed, a recording layer having a direction of magnetization thereof varied, and a non-magnetic layer interposed between the fixed layer and the recording layer; and
   a first wiring layer extending in a first direction and configured to generate a magnetic field for recording data in the magnetoresistive element,
   wherein the recording layer includes:
   a base portion extending in a second direction rotated from the first direction by an angle falling within a range of more than 0° to not more than 20°, the base portion including a first side and a second side opposing each other and extending in the second direction, the base portion also including a third side and a fourth side opposing each other; and
   a first projection and a second projection outwardly projecting from the first side and the second side, respectively, in a third direction perpendicular to the second direction, the third side and the fourth side being inclined with respect to the third direction in the same rotational direction as a rotational direction in which the second direction is rotated.

2. The magnetic memory device according to claim 1, wherein:
   the second direction corresponds to an axis of easy magnetization; and
   the third direction corresponds to an axis of hard magnetization.

3. The magnetic memory device according to claim 1, wherein the third direction is inclined, by an angle falling within a range of more than 0° to not more than 20°, with respect to a fourth direction perpendicular to the first direction.

4. The magnetic memory device according to claim 1, wherein the recording layer has a planar configuration which has 180° rotation symmetry and no reflection symmetry.

5. The magnetic memory device according to claim 1, wherein the base portion has a rectangular planar configuration which includes a first pair of diagonally opposite two corners, and a second pair of diagonally opposite two corners, the first pair of corners having an acute angle, the second pair of corners having an obtuse angle.

6. The magnetic memory device according to claim 1, wherein the base portion has a planar configuration of a parallelogram.

7. The magnetic memory device according to claim 1, wherein a length of the recording layer in the second direction is longer than a length of the recording layer in the third direction.

8. The magnetic memory device according to claim 1, wherein a length of the recording layer in the second direction is 1.5 times or more a length of the recording layer in the third direction.

9. The magnetic memory device according to claim 1, wherein the recording layer has a plurality of round corners.

10. The magnetic memory device according to claim 1, wherein the first projection has two round corners, and the second projection has two round corners.

11. The magnetic memory device according to claim 1, wherein the base portion has four round corners.

12. The magnetic memory device according to claim 1, wherein the angle falls within a range of more than 0° to not more than 15°.

13. The magnetic memory device according to claim 1, wherein the angle falls within a range of more than 0° to not more than 5°.

14. The magnetic memory device according to claim 1, further comprising a second wiring layer extending in a fourth direction perpendicular to the first direction and configured to generate a magnetic field for recording the data in the magnetoresistive element.

15. The magnetic memory device according to claim 1, wherein the fixed layer includes a ferromagnetic layer and an anti-ferromagnetic layer.

16. The magnetic memory device according to claim 1, further comprising:
   a bit line extending in a fourth direction perpendicular to the first direction, and electrically connected to a terminal of the magnetoresistive element; and
   a switching element having a terminal electrically connected to another terminal of the magnetoresistive element.

17. The magnetic memory device according to claim 16, further comprising a word line configured to control an on-state and an off-state of the switching element.

18. The magnetic memory device according to claim 16, further comprising a power supply connected to another terminal of the switching element.

19. The magnetic memory device according to claim 16, wherein the switching element is an MIS (Metal Insulator Semiconductor) transistor.

* * * * *